United States Patent
Takagi et al.

(10) Patent No.: US 11,450,524 B2
(45) Date of Patent: Sep. 20, 2022

(54) SUBSTRATE PROCESSING APPARATUS, METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventors: Kosuke Takagi, Toyama (JP); Risa Yamakoshi, Toyama (JP); Takanori Ueno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/921,343

(22) Filed: Mar. 14, 2018

(65) Prior Publication Data
US 2018/0277355 A1 Sep. 27, 2018

(30) Foreign Application Priority Data

Mar. 24, 2017 (JP) .............................. JP2017-059162

(51) Int. Cl.
*C23C 16/40* (2006.01)
*H01L 21/02* (2006.01)
(Continued)

(52) U.S. Cl.
CPC ........ *H01L 21/0228* (2013.01); *C23C 16/401* (2013.01); *C23C 16/4584* (2013.01);
(Continued)

(58) Field of Classification Search
CPC ........... H01L 21/0228; H01L 21/02164; H01L 21/02211; H01L 21/67017; H01L 21/31;
(Continued)

(56) References Cited

U.S. PATENT DOCUMENTS 6,881,295 B2 * 4/2005 Nagakura ............. C23C 16/401
118/715
2004/0025786 A1 * 2/2004 Kontani ............ C23C 16/45578
118/715
(Continued)

FOREIGN PATENT DOCUMENTS

JP 2014-063959 A 4/2014
JP 2014-236129 A 12/2014
(Continued)

OTHER PUBLICATIONS

Korean Office Action dated Aug. 16, 2019 for the Korean Patent Application No. 10-2018-0028064.
(Continued)

*Primary Examiner* — Rudy Zervigon
(74) *Attorney, Agent, or Firm* — Volpe Koenig

(57) ABSTRACT

There is provided a technique that includes a process chamber in which a process is performed to a substrate, the process including forming a film containing a main element, a first nozzle configured to supply a precursor containing the main element to the substrate in the process chamber, and a second nozzle configured to supply a reactant to the substrate in the process chamber. The first nozzle includes a first ceiling hole provided at a ceiling portion of the first nozzle and opened in a vertical direction, and a plurality of first side holes provided at a side portion of the first nozzle and opened in a horizontal direction. An opening area of the first ceiling hole is larger than an opening area of each of the plurality of first side holes.

7 Claims, 7 Drawing Sheets

(51) Int. Cl.
*C23C 16/455* (2006.01)
*C23C 16/458* (2006.01)

(52) U.S. Cl.
CPC .. *C23C 16/45502* (2013.01); *C23C 16/45544* (2013.01); *C23C 16/45546* (2013.01); *C23C 16/45578* (2013.01); *H01L 21/02164* (2013.01); *H01L 21/02211* (2013.01)

(58) Field of Classification Search
CPC .......... C23C 16/45544; C23C 16/4584; C23C 16/45578; C23C 16/45546; C23C 16/45502; C23C 16/401
USPC ........... 118/715; 156/345.31, 345.32, 345.33
See application file for complete search history.

(56) References Cited

U.S. PATENT DOCUMENTS

| | | | |
|---|---|---|---|
| 2011/0076857 A1 | 3/2011 | Akae et al. | |
| 2012/0094423 A1* | 4/2012 | Jun | C23C 14/165 438/72 |
| 2012/0180727 A1* | 7/2012 | Hasegawa | C23C 16/45578 118/730 |
| 2014/0357058 A1 | 12/2014 | Takagi et al. | |
| 2017/0051408 A1* | 2/2017 | Takagi | C23C 16/45563 |
| 2017/0103885 A1 | 4/2017 | Nakamura et al. | |
| 2017/0232457 A1* | 8/2017 | Fujino | B05B 7/1693 118/724 |
| 2018/0233351 A1 | 8/2018 | Nakamura et al. | |
| 2019/0189422 A1 | 6/2019 | Nakamura et al. | |

FOREIGN PATENT DOCUMENTS

| | | |
|---|---|---|
| JP | 05-958231 B2 | 7/2016 |
| JP | 2017-028256 A | 2/2017 |
| KR | 10-1189495 B1 | 10/2012 |
| KR | 10-2017-0018343 A | 2/2017 |

OTHER PUBLICATIONS

Japanese Office Action dated Jan. 7, 2020 for the Japanese Patent Application No. 2017-059162.
Korean Office Action dated Jul. 14, 2020 for Korean Patent Application No. 10-2020-0076775.
Chinese Office Action dated Jun. 29, 2021 for Chinese Patent Application No. 201810179758.4.
Japanese Office Action dated Sep. 21, 2021 for Japanese Patent Application No. 2020-147502.

* cited by examiner

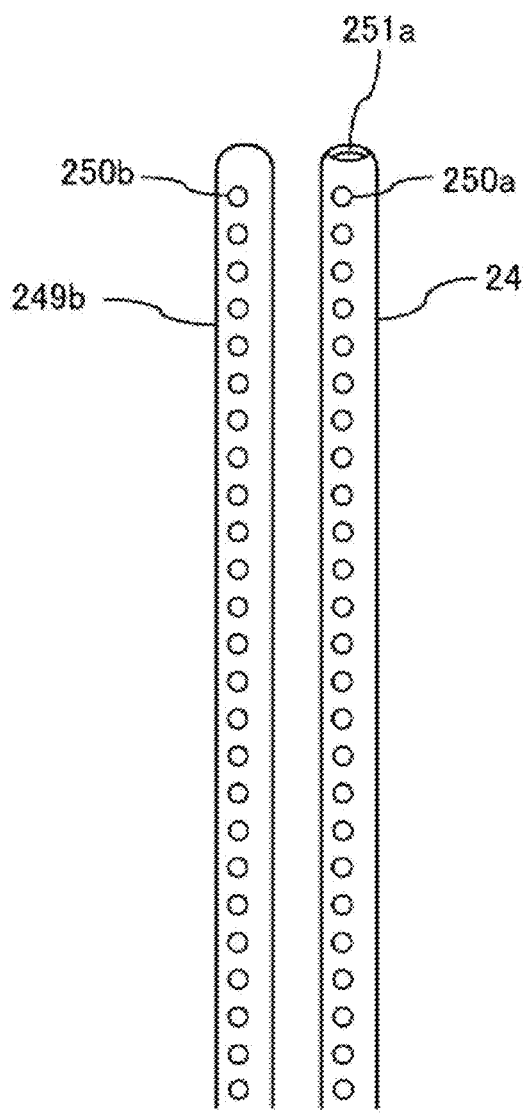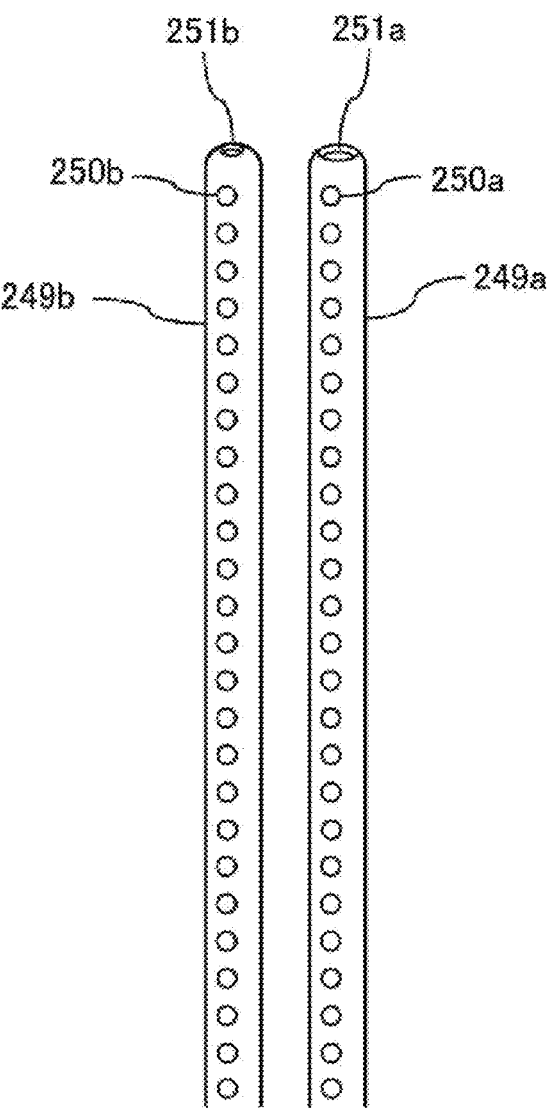

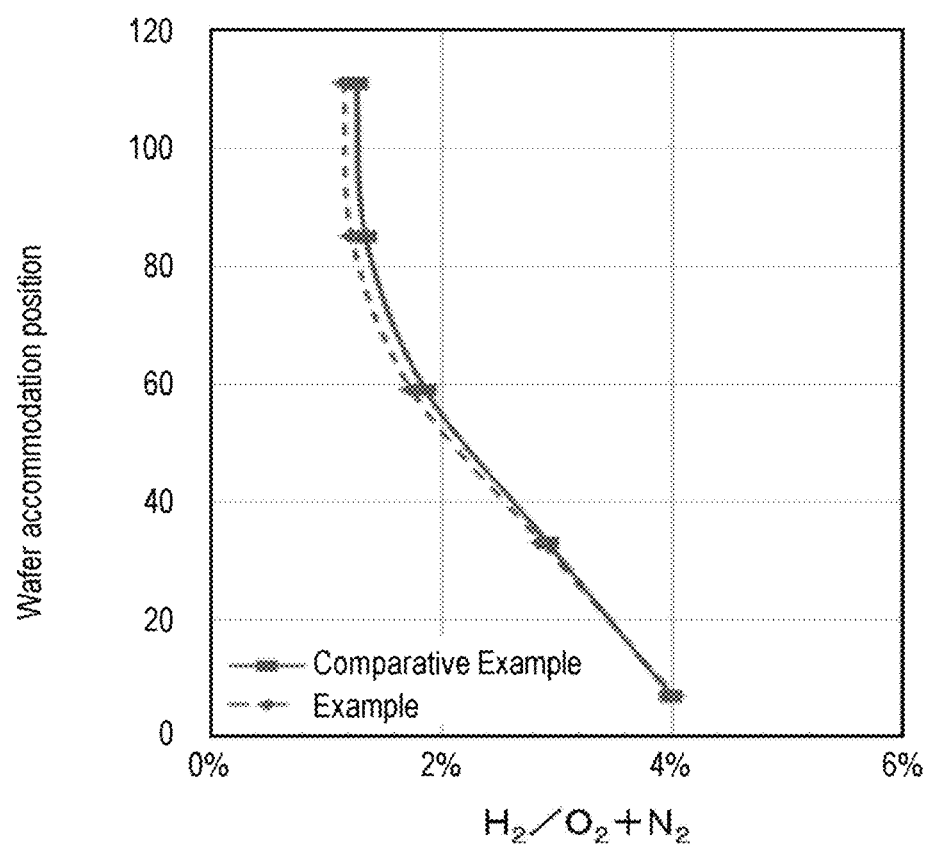

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION(S)

This application is based upon and claims the benefit of priority from Japanese Patent Application No. 2017-059162, filed on Mar. 24, 2017, the entire contents of which are incorporated herein by reference.

TECHNICAL FIELD

The present disclosure relates to a substrate processing apparatus, a method of manufacturing a semiconductor device, and a recording medium.

BACKGROUND

As an example of processes of manufacturing a semiconductor device, a process of supplying a precursor and a reactant to a plurality of substrates and forming films on these substrates may be performed in some cases.

SUMMARY

Some embodiments of the present disclosure provide a technique capable of, when forming films on a plurality of substrates, improving the substrate-to-substrate film thickness uniformity of the films formed on the substrates.

According to one embodiment of the present disclosure, there is provided a technique that includes a process chamber in which a process is performed to a substrate, the process including forming a film containing a main element, a first nozzle configured to supply a precursor containing the main element to the substrate in the process chamber, and a second nozzle configured to supply a reactant to the substrate in the process chamber. The first nozzle includes a first ceiling hole provided at a ceiling portion of the first nozzle and opened in a vertical direction, and a plurality of first side holes provided at a side portion of the first nozzle and opened in a horizontal direction. An opening area of the first ceiling hole is larger than an opening area of each of the plurality of first side holes.

BRIEF DESCRIPTION OF DRAWINGS

FIG. 5A is a diagram showing a configuration example of first and second nozzles suitably used in one embodiment of the present disclosure, and FIG. 5B is a diagram showing a modification thereof.

FIG. 8 is a diagram showing concentration distributions of an $H_2$ gas in a process chamber of an example and a comparative example.

DETAILED DESCRIPTION

Figure 1:
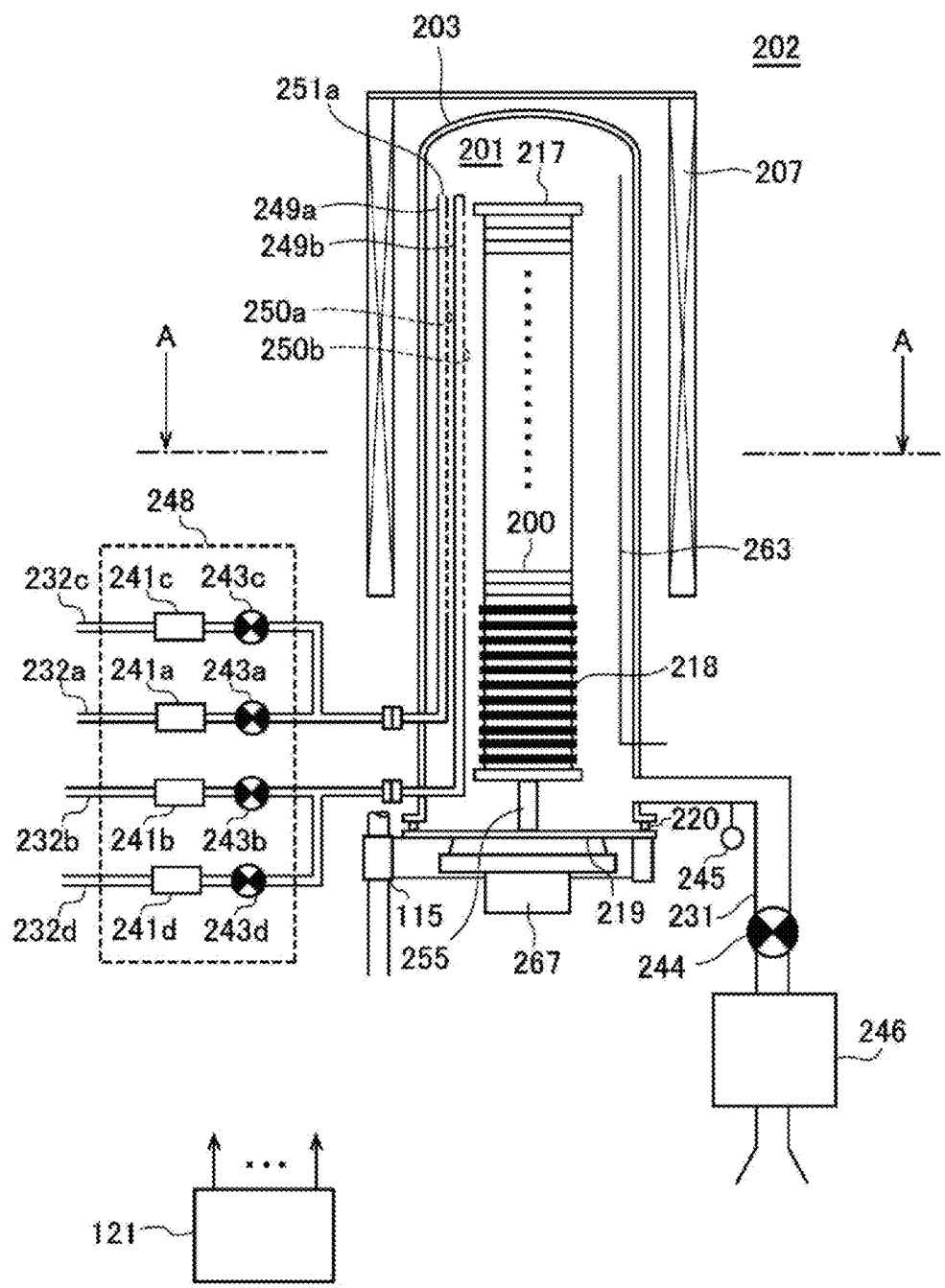
FIG. 1 is a schematic configuration view of a vertical processing furnace of a substrate processing apparatus suitably used in one embodiment of the present disclosure, in which a portion of the processing furnace is shown in a vertical cross section.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

One Embodiment of the Present Disclosure

One embodiment of the present disclosure will now be described with reference to FIGS. 1 to 5A.

(1) Configuration of Substrate Processing Apparatus

As shown in FIG. 1, a processing furnace 202 includes a heater 207 as a heating means (heating mechanism). The heater 207 has a cylindrical shape and is supported by a holding plate so as to be vertically installed. The heater 207 also functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, e.g., quartz ($SiO_2$), silicon carbide (SiC) or the like and is formed in a cylindrical shape with its upper end closed and its lower end opened. A process chamber 201 is formed in a hollow cylindrical portion of the reaction tube 203. The process chamber 201 is configured to accommodate wafers 200 as substrates.

In the process chamber 201, a nozzle 249a as a first nozzle and a nozzle 249b as a second nozzle are provided so as to penetrate the lower side wall of the reaction tube 203. Gas supply pipes 232a and 232b are connected to the nozzles 249a and 249b, respectively.

Mass flow controllers (MFCs) 241a and 241b as flow rate controllers (flow rate control parts) and valves 243a and 243b as opening/closing valves are provided in the gas supply pipes 232a and 232b sequentially from the gas flow upstream sides. Gas supply pipes 232c and 232d for supplying an inert gas are connected to the gas supply pipes 232a and 232b on the downstream sides of the valves 243a and 243b. MFCs 241c and 241d and valves 243c and 243d are provided in the gas supply pipes 232c and 232d sequentially from the gas flow upstream sides.

Figure 2:
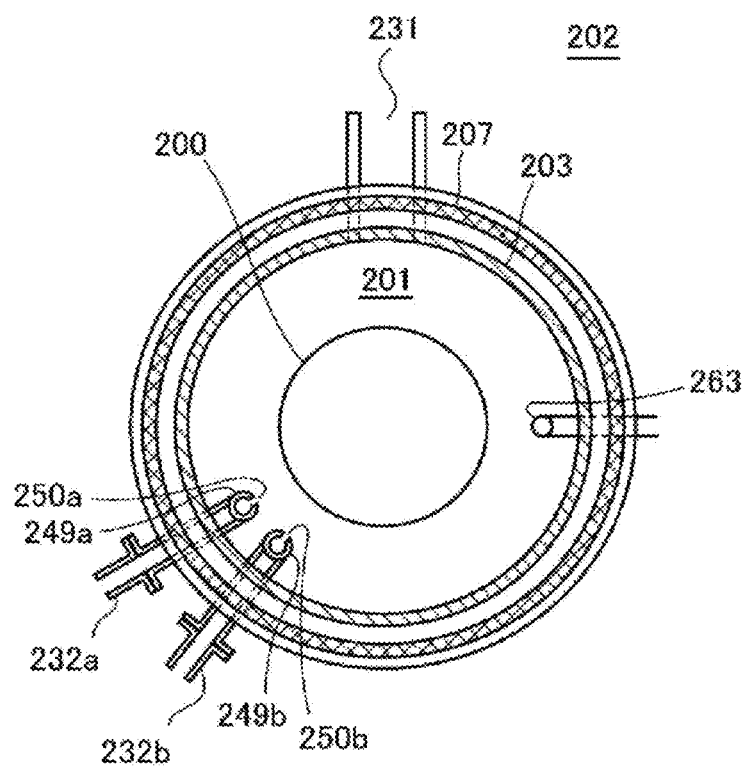
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 2, the nozzles 249a and 249b are provided at a space having an annular plan-view shape between the inner wall of the reaction tube 203 and the wafers 200 so as to extend upward in the arrangement direction of the wafers 200 from the lower portion of the inner wall of the reaction tube 203 to the upper portion thereof (the ceiling portion of the process chamber 201). That is to say, the nozzles 249a and 249b are respectively provided on a lateral side of a wafer arrangement region in which the wafers 200 are arranged, namely in a region which horizontally surrounds the wafer arrangement region, so as to extend along the wafer arrangement region.

At the ceiling of the nozzle 249a, as shown in FIG. 5A, a gas supply hole 251a as a first ceiling hole for supplying a gas is provided. The gas supply hole 251a is opened upward in the vertical direction and is capable of supplying a gas toward the ceiling portion of the process chamber 201. A ceiling hole opened upward in the vertical direction is not provided at the ceiling portion of the nozzle 249b.

Gas supply holes 250a as first side holes for supplying a gas and gas supply holes 250b as second side holes are respectively provided at the side surfaces of the nozzles 249a and 249b. The gas supply holes 250a and 250b are respectively opened so as to face the center of the reaction tube 203 and are configured to be capable of supplying a gas toward the wafers 200. The gas supply holes 250a and 250b are provided in a plural number from the lower portion of the reaction tube 203 to the upper portion thereof. In the case where a boat 217 to be described later holds, for example, 120 wafers 200, 120 gas supply holes 250a and 250b (the same number as the number of the wafers 200 accommodated) are formed in the side surfaces of the nozzles 249a and 249b to be a one-to-one correspondence to the wafers 200.

In the present embodiment, the opening areas of the gas supply holes 250a and 250b are equal to each other. In addition, the opening area of the gas supply hole 251a is larger than the opening area of each of the gas supply holes 250a. Specifically, each of the gas supply holes 251a and 250a is formed in a circular shape, the diameters of the gas supply holes 250a and 250b are equal to each other, and the diameter of the gas supply hole 251a is set to fall within a range of not less than two times to not more than eight times the diameter of each of the gas supply holes 250a and 250b.

From the gas supply pipe 232a, for example, a halosilane precursor gas containing silicon (Si) as a main element constituting a film to be formed and a halogen element is supplied into the process chamber 201 via the MFC 241a, the valve 243a and the nozzle 249a.

The precursor gas refers to a gaseous precursor, for example, a gas obtained by vaporizing a precursor remaining in a liquid state under room temperature and atmospheric pressure, a precursor remaining in a gaseous state under room temperature and atmospheric pressure, and the like. The halosilane precursor is a silane precursor having a halogen group. The halogen group includes a halogen element such as chlorine (Cl), fluorine (F), bromine (Br), iodine (I) or the like. As the halosilane precursor gas, for example, a precursor gas containing Si and Cl, i.e., a chlorosilane precursor gas may be used. The chlorosilane precursor gas acts as a Si source. As the chlorosilane precursor gas, for example, a hexachlorodisilane ($Si_2Cl_6$, abbreviation: HCDS) gas may be used.

From the gas supply pipe 232b, for example, an oxygen (O)-containing gas as a first reactant (first reaction gas) is supplied into the process chamber 201 via the MFC 241b, the valve 243b and the nozzle 249b. The O-containing gas acts as an oxidizing source (an oxidizing agent or an oxidizing gas), i.e., an O source. As the O-containing gas, for example, an oxygen ($O_2$) gas may be used.

From the gas supply pipe 232a, for example, a hydrogen (H)-containing gas as a second reactant (second reaction gas) is supplied into the process chamber 201 via the MFC 241a, the valve 243a and the nozzle 249a. The H-containing gas cannot obtain an oxidizing action by itself. However, in the film forming process to be described later, the H-containing gas reacts with the O-containing gas under specific conditions to generate an oxidizing species such as atomic oxygen (O) or the like, and acts to improve the efficiency of an oxidizing process. As the H-containing gas, for example, a hydrogen ($H_2$) gas may be used.

From the gas supply pipes 232c and 232d, for example, a nitrogen ($N_2$) gas as an inert gas is supplied into the process chamber 201 via the MFCs 241c and 241d, the valves 243c and 243d, the gas supply pipes 232a and 232b, and the nozzles 249a and 249b. The $N_2$ gas acts as a purge gas or a carrier gas.

A first supply system (precursor supply system) is mainly configured by the gas supply pipe 232a, the MFC 241a and the valve 243a. A second supply system (reactant supply system) is mainly configured by the gas supply pipes 232a and 232b, the MFCs 241a and 241b, and the valves 243a and 243b. An inert gas supply system is mainly configured by the gas supply pipes 232c and 232d, the MFCs 241c and 241d, and the valves 243c and 243d.

Either or all of the above-described various supply systems may be configured as an integrated supply system 248 in which the valves 243a to 243d, the MFCs 241a to 241d and the like are integrated. The integrated supply system 248 is connected to the respective gas supply pipes 232a to 232d such that the operations of supplying various gases into the gas supply pipes 232a to 232d, i.e., the opening/closing operations of the valves 243a to 243d and the flow rate adjustment operations by the MFCs 241a to 241d, and the like are controlled by a controller 121 which will be described later. The integrated supply system 248 is configured as an integral type or divisional type integrated unit and is configured to be attached to and detached from the gas supply pipes 232a to 232d or the like in an integrated unit basis, so that the maintenance, replacement, expansion or the like of the integrated supply system 248 can be performed on an integrated unit basis.

An exhaust pipe 231 configured to exhaust the atmosphere inside the process chamber 201 is connected to the lower portion of the side wall of the reaction tube 203. A vacuum pump 246 as a vacuum exhaust device is connected to the exhaust pipe 231 via a pressure sensor 245 as a pressure detector (pressure detection part), which detects the pressure inside the process chamber 201, and an auto pressure controller (APC) valve 244 as a pressure regulator (pressure regulation part). The APC valve 244 is configured such that the vacuum-exhaust of the interior of the process chamber 201 and the stop of the vacuum-exhaust can be performed by opening and closing the APC valve 244 while operating the vacuum pump 246 and such that the pressure inside the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be included in the exhaust system.

A seal cap 219, which serves as a furnace opening cover capable of airtightly sealing a lower end opening of the reaction tube 203, is provided below the reaction tube 203. The seal cap 219 is made of a metallic material such as, e.g., stainless steel or the like, and is formed in a disc shape. An O-ring 220, which is a seal member making contact with the lower end portion of the reaction tube 203, is provided on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured as a transfer device (transfer mechanism) which loads and unloads (transfers) the wafers 200 into and out of the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of, e.g., a heat resistant material such as quartz or SiC are installed below the boat 217 in multiple stages.

A temperature sensor 263 serving as a temperature detector is installed in the reaction tube 203. Based on temperature information detected by the temperature sensor 263, the state of supplying electric power to the heater 207 is adjusted such that the interior of the process chamber 201 has a desired temperature distribution. The temperature sensor 263 is provided along the inner wall of the reaction tube 203.

Figure 3:
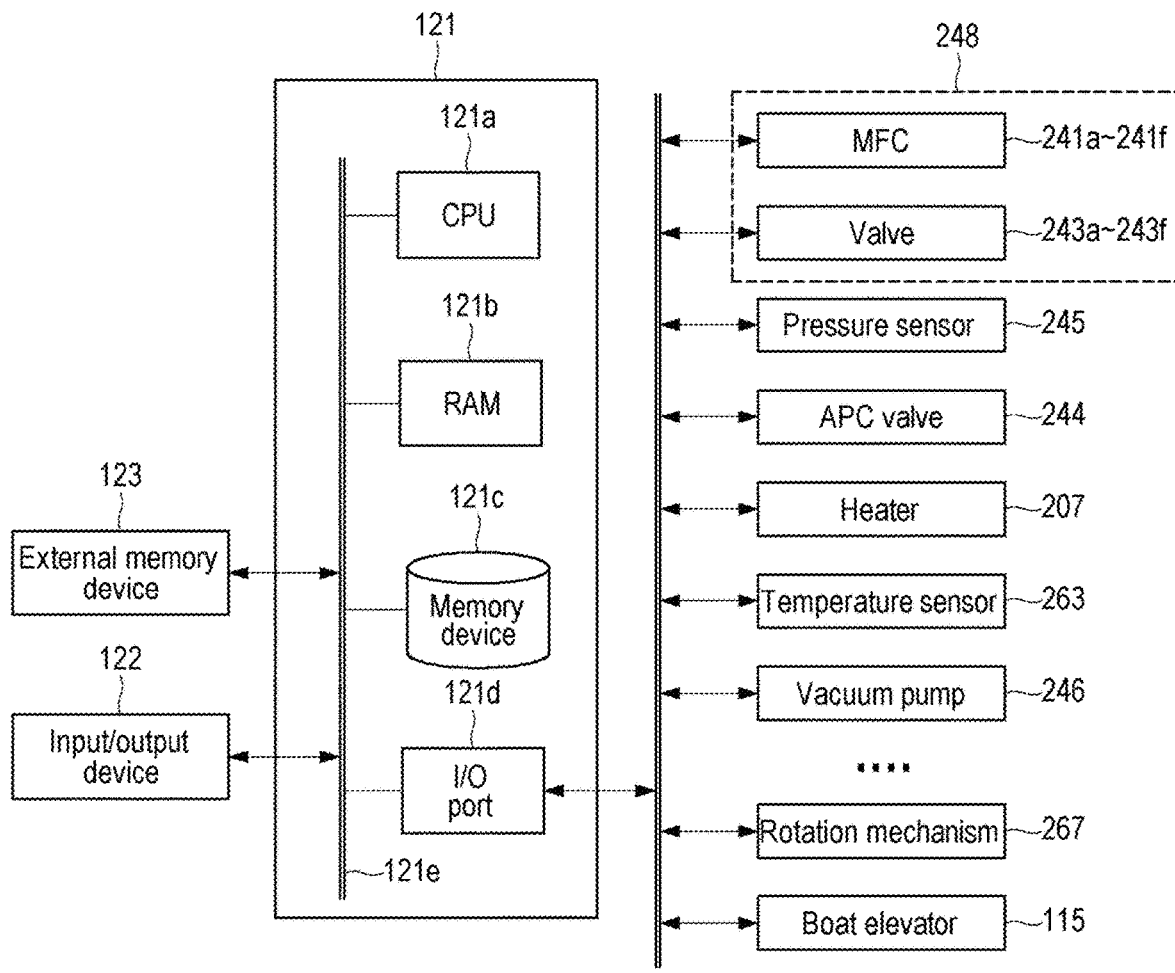
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c may be, for example, a flash memory, a hard disc drive (HDD), or the like. A control program for controlling operations of a substrate processing apparatus, or a process recipe, in which sequences and conditions of a film forming process to be described later are written, are readably stored in the memory device 121c. The process recipe functions as a program for causing the controller 121 to execute each sequence in the film forming process, which will be described later, to obtain a predetermined result. Hereinafter, the process recipe and the control program will be collectively and simply referred to as a "program." Furthermore, the process recipe will also be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and the like.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on a computer, the above-described program stored in an external memory device (for example, a magnetic disk such as an HDD or the like, an optical disk such as a CD or the like, a magneto-optical disk such as MO, or the like, or a semiconductor memory such as a USB memory or the like) 123. The memory device 121c and the external memory device 123 are configured as a computer-readable recording medium. Hereinafter, the memory device 121c and the external memory device 123 are also collectively and simply referred to as a recording medium. When the term "recording medium" is used herein, it may indicate a case including only the memory device 121c, a case of including only the external memory device 123, or a case including both the memory device 121c and the external memory device 123. The program may be provided to the computer using communication means such as the Internet or a dedicated line without using the external memory device 123.

(2) Substrate Processing Process

A sequence example of forming a silicon oxide film (SiO film) on a wafer 200 as a substrate using the aforementioned substrate processing apparatus, which is one process for manufacturing a semiconductor device, will be described below with reference to FIG. 4. In the following description, the operations of the respective parts that constitute the substrate processing apparatus are controlled by the controller 121.

Figure 4:
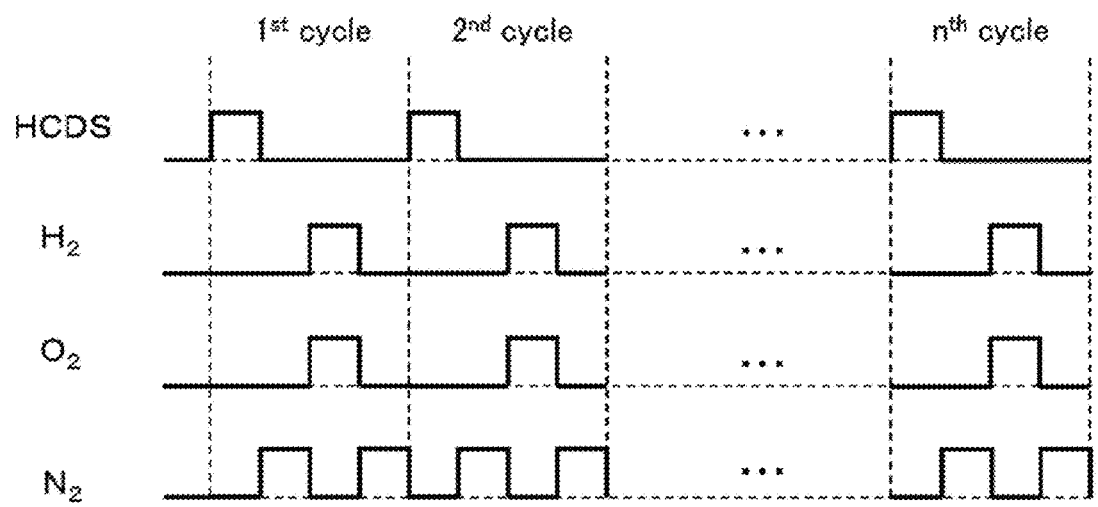
FIG. 4 is a diagram showing a film forming sequence according to one embodiment of the present disclosure.

In the film forming sequence shown in FIG. 4, an SiO film as a film containing Si and O is formed on a wafer 200 by performing a cycle a predetermined number of times (once or more), the cycle including: step 1 of supplying a HCDS gas to the wafer 200 from a nozzle 249a; and step 2 of supplying an $O_2$ gas to the wafer 200 from a nozzle 249b.

Further, step 2 described above includes a period during which an $O_2$ gas and an $H_2$ gas are simultaneously supplied to the wafer 200. The $H_2$ gas is supplied from the nozzle 249a.

In the present disclosure, for the sake of convenience, the film forming sequence shown in FIG. 4 may be denoted as follows. The same notation is also used for the film forming sequences of the modifications and other embodiments to be described later.

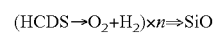

$(HCDS \rightarrow O_2 + H_2) \times n \Rightarrow SiO$

As used herein, the term "wafer" may refer to a wafer itself or a laminate of a wafer and a predetermined layer or film formed on the surface of the wafer. As used herein, the term "the surface of a wafer" may refer to the surface of a wafer itself or the surface of a predetermined layer or the like formed on the wafer. As used herein, the phrase "to form a predetermined layer on a wafer" may mean that a predetermined layer is formed directly on the surface of a wafer itself, or may mean that a predetermined layer is formed on a layer or the like formed on a wafer. As used herein, the term "substrate" is synonymous with the word "wafer."

(Wafer charging and boat loading)

A plurality of wafers 200 are charged into the boat 217 (wafer charging). Thereafter, as shown in FIG. 1, the boat 217 supporting the plurality of wafers 200 is lifted by the boat elevator 115 and is loaded into the process chamber 201 (boat loading). In this state, the seal cap 219 seals the lower end of the reaction tube 203 via the O-ring 220.

(Pressure Regulation and Temperature Adjustment)

The inside of the process chamber 201 is vacuum-exhausted (depressurization-exhausted) by the vacuum pump 246 so that the inside of the process chamber 201, i.e., the space where the wafers 200 exist, reach a desired pressure (degree of vacuum). At this time, the pressure inside the process chamber 201 is measured by the pressure sensor 245, and the APC valve 244 is feedback-controlled based on the measured pressure information. Furthermore, the wafers 200 in the process chamber 201 are heated by the heater 207 to become a desired temperature. At this time, the state of supplying electric power to the heater 207 is feedback-controlled based on the temperature information detected by the temperature sensor 263 such that the inside of the process chamber 201 has a desired temperature distribution. Moreover, the rotation of the wafers 200 by the rotation mechanism 267 is started. Exhausting of the inside of the process chamber 201 and the heating and rotation of the wafers 200 are all continuously performed at least until the processing on the wafers 200 is completed.

(Film Forming Step)

Thereafter, the following steps 1 and 2 are sequentially executed.

[Step 1]

In this step, an HCDS gas is supplied to the wafers 200 in the process chamber 201.

Specifically, the valve 243a is opened to allow the HCDS gas to flow through the gas supply pipe 232a. The flow rate of the HCDS gas is adjusted by the MFC 241a. The HCDS gas is supplied into the process chamber 201 via the nozzle 249a. The HCDS gas is supplied into the process chamber 201 from the gas supply hole 251a and the gas supply holes 250a provided in the nozzle 249a, and is then exhausted from the exhaust pipe 231. At this time, the HCDS gas is supplied to the wafers 200. In this case, the valves 243c and 243d may be opened to allow an $N_2$ gas to flow through the gas supply pipes 232c and 232d. In this case, the flow rate of the $N_2$ gas is adjusted by the MFCs 241c and 241d. The $N_2$ gas is supplied into the process chamber 201 via the nozzles 249a and 249b.

By supplying the HCDS gas to the wafer 200, a Si-containing layer (first layer) containing Cl is formed on the surface of the wafer 200. The Si-containing layer containing Cl is formed on the surface of the wafer 200 by the physisorption of HCDS, the chemisorption of a substance resulting from decomposition of a part of HCDS, the thermal decomposition of HCDS, or the like. That is to say, the Si-containing layer containing Cl may be an adsorption layer (physisorption layer or chemisorption layer) of HCDS or a substance resulting from decomposition of a part of HCDS, or may be a Si layer containing Cl. Hereinafter, the Si-containing layer containing Cl is also simply referred to as a Si-containing layer.

After forming the Si-containing layer on the wafer 200, the valve 243a is closed to stop the supply of the HCDS gas into the process chamber 201. Then, the inside of the process chamber 201 is vacuum-exhausted to thereby remove the gas or the like remaining in the process chamber 201 from the inside of the process chamber 201. At this time, the valves 243c and 243d are opened to supply the $N_2$ gas into the process chamber 201. The $N_2$ gas acts as a purge gas.

[Step 2]

After step 1 is completed, an $O_2$ gas and an $H_2$ gas are simultaneously supplied from the different nozzles to the wafers 200 in the process chamber 201.

Specifically, the valves 243b and 243a are opened to allow the $O_2$ gas and the $H_2$ gas to flow through the gas supply pipes 232b and 232a, respectively. The flow rates of the $O_2$ gas and the $H_2$ gas are adjusted by the MFCs 241b and 241a, respectively. The $O_2$ gas and the $H_2$ gas are supplied into the process chamber 201 via the nozzles 249b and 249a. The $O_2$ gas is supplied into the process chamber 201 from the respective gas supply holes 250b provided in the nozzle 249b. The $H_2$ gas is supplied from the gas supply hole 251a and the gas supply holes 250a provided in the nozzle 249a into the process chamber 201. The $O_2$ gas and the $H_2$ gas are mixed and react with each other in the process chamber 201, and then exhausted from the exhaust pipe 231. At this time, the $O_2$ gas and the $H_2$ gas are simultaneously and collectively supplied to the wafer 200. The opening/closing control of the valves 243c and 243d is the same as the opening/closing control of the valves 243c and 243d in step 1.

By simultaneously and collectively supplying the $O_2$ gas and the $H_2$ gas into the process chamber 201, these gases are thermally activated (excited) in a non-plasma manner under a heated and depressurized atmosphere and react with each other, whereby a moisture ($H_2O$)-free oxidizing species containing oxygen such as atomic oxygen (O) or the like is generated. Then, the Si-containing layer formed on the wafer 200 in step 1 is oxidized mainly by the oxidizing species. The energy of the oxidizing species is higher than the bonding energy of a Si—Cl bond or the like contained in the Si-containing layer. Therefore, by giving the energy of the oxidizing species to the Si-containing layer, the Si—Cl bond or the like is broken. Cl or the like whose bond with Si is broken is removed from the layer and is discharged as $Cl_2$, HCl and the like. In addition, the bonding hand of Si whose bond with Cl or the like is broken is combined with O contained in the oxidizing species, thereby forming a Si—O bond. In this way, the Si-containing layer is changed (modified) into a layer containing Si and O and having a low content of impurities such as Cl or the like, i.e., a highly pure SiO layer (second layer). According to this oxidizing process, the oxidizing power may be greatly improved as compared with a case where the $O_2$ gas is supplied alone or a case where the $H_2O$ gas (water vapor) is supplied alone. That is to say, by adding the $H_2$ gas to the $O_2$ gas under a depressurized atmosphere, an effect of greatly improving the oxidizing power may be obtained as compared with the case of supplying the $O_2$ gas alone or the case of supplying the $H_2O$ gas alone.

After changing the Si-containing layer into the SiO layer, the valves 243b and 243a are closed to stop the supply of the $O_2$ gas and the $H_2$ gas into the process chamber 201. Then, the gas and the like remaining in the process chamber 201 are removed from the inside of the process chamber 201 by the same processing procedure as in step 1.

[Performing a Predetermined Number of Times]

An SiO film may be formed on the wafer 200 by performing a cycle once or more (n times), the cycle including performing steps 1 and 2 simultaneously, i.e., without synchronization. The aforementioned cycle may be repeated a plurality of times. That is to say, the thickness of the SiO layer formed per cycle may be set to be smaller than a desired film thickness, and the aforementioned cycle may be repeated a plurality of times until the film thickness of the SiO film formed by laminating the SiO layer becomes the desired film thickness.

An example of the processing conditions in step 1 is as follows.

HCDS gas supply flow rate: 10 to 2000 sccm, specifically, 100 to 1000 sccm
HCDS gas supply time: 1 to 120 seconds, specifically, 1 to 60 seconds
$N_2$ gas supply flow rate (per gas supply pipe): 10 to 10000 sccm
Processing temperature: 250 to 800 degrees C., specifically, 400 to 700 degrees C.
Processing pressure: 1 to 2666 Pa, specifically, 67 to 1333 Pa An example of the processing conditions in step 2 is as follows.

$O_2$ gas supply flow rate: 100 to 10000 sccm
$H_2$ gas supply flow rate: 100 to 10000 sccm
$O_2$ gas and $H_2$ gas supply time: 1 to 120 seconds, specifically, 1 to 60 seconds
Processing pressure: 13.3 to 1333 Pa, specifically, 13.3 to 399 Pa Other processing conditions are the same as the processing conditions in step 1.

As the precursor gas, other than the HCDS gas, a chlorosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, or the like may be used.

As the first reaction gas, other than the $O_2$ gas, an O-containing gas such as a nitrous oxide ($N_2O$) gas, a nitrogen monoxide (NO) gas, a nitrogen dioxide ($NO_2$) gas, an ozone ($O_3$) gas, an $H_2+O_3$ gas, a water vapor ($H_2O$ gas), a carbon monoxide (CO) gas, a carbon dioxide ($CO_2$) gas, or the like may be used.

As the second reaction gas, other than the $H_2$ gas, an H-containing gas such as a deuterium ($D_2$) gas or the like may be used.

As the inert gas, other than the $N_2$ gas, for example, a rare gas such as an Ar gas, a He gas, a Ne gas, a Xe gas or the like may be used.

(After-Purging and Atmospheric Pressure Return)

After the film forming step is completed, the $N_2$ gas is supplied into the process chamber 201 from each of the gas supply pipes 232c and 232d, and is exhausted from the exhaust pipe 231. The $N_2$ gas acts as a purge gas. As a result, the inside of the process chamber 201 is purged, and the gas or the reaction byproduct remaining in the process chamber 201 is removed from the inside of the process chamber 201 (after-purging). Thereafter, the atmosphere in the process chamber 201 is replaced with an inert gas (inert gas replacement), and the pressure inside the process chamber 201 is returned to atmospheric pressure (atmospheric pressure return).

(Boat Unloading and Wafer Discharging)

The seal cap 219 is moved down by the boat elevator 115 and the lower end of the reaction tube 203 is opened. Then, the processed wafers 200 are unloaded from the lower end of the reaction tube 203 and moved outside of the reaction tube 203 in a state in which they are supported by the boat 217 (boat unloading). The processed wafers 200 are taken out and moved outside of the reaction tube 203 and are then discharged from the boat 217 (wafer discharging).

(3) Effects of the Present Embodiment

According to the present embodiment, one or more of the following effects may be obtained.

(a) By providing the gas supply hole 251a at the ceiling portion of the nozzle 249a for supplying the HCDS gas and making the opening area of the gas supply hole 251a larger than the opening area of each of the gas supply holes 250a provided at the side portion of the nozzle 249a, it is possible to improve the wafer-to-wafer film thickness uniformity (hereinafter also referred to as WtW) of the SiO film formed on the wafer 200.

If the gas supply hole 251a is not provided at the ceiling portion of the nozzle 249a, when step 1 is performed, the concentration of the HCDS gas in the upper region of the wafer accommodation region (wafer arrangement region) inside the process chamber 201 may become low, so that the supply amount of the HCDS gas to the wafer 200 accommodated in the upper region may become insufficient. As a result, the film thickness of the SiO film formed on the wafer 200 accommodated in the upper region may be thinner than the film thickness of the SiO film formed on the wafer 200 accommodated in the lower region or the central region of the wafer accommodation region. That is to say, the WtW of the SiO film formed on the wafer 200 may decrease. Even though the gas supply hole 251a is provided at the ceiling portion of the nozzle 249a, if the opening area of the gas supply hole 251a is equal to or smaller than the opening area of each of the gas supply holes 250a provided at the side portion of the nozzle 249a, when step 1 is performed, the concentration of the HCDS gas in the upper region of the wafer accommodation region may be still low, and the supply amount of the HCDS gas to the wafer 200 accommodated in the upper region may be still insufficient. Thus, the WtW of the SiO film formed on the wafer 200 may show the same tendency as the WtW of the case where the gas supply hole 251a is not provided.

On the other hand, as in the present embodiment, by providing the gas supply hole 251a at the ceiling portion of the nozzle 249a and making the aperture area of the gas supply hole 251a large as described above, when step 1 is performed, it is possible to control the process such that the concentration of the HCDS gas is increased in the upper region of the wafer accommodation region, i.e., the supply amount of the HCDS gas to the wafer 200 accommodated in the upper region is increased. This makes it possible to increase the film thickness of the SiO film formed on the wafer 200 accommodated in the upper region of the wafer accommodation region. As a result, it is possible to improve the WtW of the SiO film formed on the wafer 200.

In addition, if the diameter of the gas supply hole 251a is set to be not less than two times the diameter of the gas supply holes 250a, it is possible to further increase the concentration of the HCDS gas in the upper region of the wafer accommodation region. As a result, it is possible to further improve the WtW of the SiO film formed on the wafer 200. However, if the diameter of the gas supply hole 251a is set to be more than eight times the diameter of the gas supply holes 250a, the pressure inside the nozzle 249a may decrease, and the flow velocity of the gas supplied horizontally from the gas supply holes 250a may be insufficient. In addition, the staying time of the HCDS gas in the nozzle 249a may be short, and the decomposition of the HCDS gas after being supplied from the nozzle 249a to the process chamber 201 may be less likely to proceed. In these cases, the film thickness of the SiO film formed on the wafer 200 accommodated in the lower region or the central region of the wafer accommodation region may be thinner than the film thickness of the SiO film formed on the wafer 200 accommodated in the upper region of the wafer accommodation region. Thus, the WtW may decrease. In addition, the wafer in-plane film thickness uniformity (hereinafter also referred to as WiW) of the SiO film formed on the wafer 200 may decrease. By setting the diameter of the gas supply hole 251a to become not more than eight times the diameter of the gas supply holes 250a, it is possible to solve these problems. In view of the foregoing, it is desirable that the diameter of the gas supply hole 251a is not less than two times and not more than eight times the diameter of the gas supply holes 250a. When the diameter of the gas supply holes 250b of the nozzle 249b is set to be equal to the diameter of the gas supply holes 250a of the nozzle 249a, it is desirable that the diameter of the gas supply hole 251a is not less than two times and not more than eight times the diameter of the gas supply holes 250b.

(b) By providing the gas supply hole 251a at the ceiling portion of the nozzle 249a for supplying the HCDS gas and making the opening area of the gas supply hole 251a larger than the opening area of each of the gas supply holes 250a provided at the side portion of the nozzle 249a, it is possible to improve the WiW of the SiO film formed on the wafer 200.

If the gas supply hole 251a is not provided at the ceiling portion of the nozzle 249a, as described above, when step 1 is performed, the concentration of the HCDS gas in the upper region of the wafer accommodation region may become low, and the supply amount of the HCDS gas to the wafer 200 accommodated in the upper region may be insufficient. In this case, the wafer in-plane film thickness distribution (hereinafter also referred to as in-plane film thickness distribution) of the SiO film formed on the wafer 200 accommodated in the upper region may become a distribution (hereinafter also referred to as center concave distribution) in which the film thickness is thickest in the peripheral edge portion (peripheral portion) of the surface of the wafer 200 and is gradually thinned toward the central portion of the surface of the wafer 200. Even though the gas supply hole 251a is provided at the ceiling portion of the nozzle 249a, if the opening area of the gas supply hole 251a is equal to or smaller than the opening area of each of the gas supply holes 250a provided at the side portion of the nozzle 249a, when step 1 is performed, the concentration of the HCDS gas in the upper region of the wafer accommodation region may be still low, and the supply amount of the HCDS gas to the wafer 200 accommodated in the upper region may still be insufficient. Thus, the in-plane film thickness distribution of the SiO film formed on the wafer 200 accommodated in the upper region may show the same tendency as the in-plane film thickness distribution of the case where the gas supply hole 251a is not provided.

On the other hand, as in the present embodiment, by providing the gas supply hole 251a at the ceiling portion of the nozzle 249a and making the aperture area of the gas supply hole 251a large as described above, when step 1 is performed, it is possible to control the process such that the concentration of the HCDS gas is increased in the upper region of the wafer accommodation region, i.e., the supply amount of the HCDS gas to the wafer 200 accommodated in the upper region is increased. Thus, the in-plane film thickness distribution of the SiO film formed on the wafer 200 accommodated in the upper region of the wafer accommodation region may be brought from the center concave distribution closer to a flat film thickness distribution (hereinafter also referred to as flat distribution) in which a change in film thickness is small from the central portion of the surface of the wafer 200 to the peripheral edge portion thereof. That is to say, it is possible to reduce the degree of the center concave distribution of the SiO film formed on the wafer 200, thereby improving the WiW.

(c) The above effects may be similarly obtained even in the case of using the precursor gas other than the HCDS gas, the case of using the O-containing gas other than the $O_2$ gas, the case of using the H-containing gas other than the $H_2$ gas, or the case of using the inert gas other than the $N_2$ gas.

Other Embodiments of the Present Disclosure

The embodiment of the present disclosure has been concretely described above. However, the present disclosure is not limited to the above-described embodiment, and various modifications may be made without departing from the spirit of the present disclosure.

For example, as shown in FIG. 5B, a gas supply hole 251b serving as a second ceiling hole opened in the vertical direction may be provided at the ceiling portion of the nozzle 249b. In this case, the opening area of the gas supply hole 251a is formed larger than the opening area of the gas supply hole 251b and is also formed larger than the opening area of the gas supply holes 250b. Specifically, when the gas supply holes 251a, 251b and 250b are formed in a circular shape, the diameter of the gas supply hole 251a is not less than two times and not more than eight times the diameter of the gas supply hole 250b. Furthermore, specifically, the diameter of the gas supply hole 251a is set to be not less than two times and not more than eight times the diameter of the gas supply hole 251b. Even when using the nozzles 249a and 249b having the configurations shown in FIG. 5B, effects similar to those of the above-described embodiment may be obtained. The gas supply hole 251b acts to prevent the gas from staying in the nozzle 249b.

Further, for example, a nitrogen (N)-containing gas such as an ammonia ($NH_3$) gas or the like, a carbon (C)-containing gas such as propylene ($C_3H_6$) gas or the like, a gas containing N and C such as a triethylamine (($C_2H_5$)$_3$N, abbreviation: TEA) gas or the like, and a boron (B)-containing gas such as a trichloroborane ($BCl_3$) gas or the like may be used as the reactant to form a silicon oxynitride film (SiON film), a silicon nitride film (SiN film), a silicon carbonitride film (SiCN film), a silicon oxycarbonitride film (SiOCN film), a silicon borocarbonitride film (SiBCN film), a silicon boronitride film (SiBN film), and the like on the substrate according to the following film forming sequences. Even in these cases, effects similar to those of the above-described embodiment may be obtained. Processing procedures and processing conditions at the time of supplying these reactants may be, for example, the same as those at the time of supplying the reactant in the above-described embodiment.

(HCDS→$NH_3$→$O_2$)×$n$⇒SiON (HCDS→$NH_3$)×$n$⇒SiN (HCDS→TEA)×$n$⇒SiCN (HCDS→$C_3H_6$→$NH_3$)×$n$⇒SiCN (HCDS→TEA→$O_2$)×$n$⇒SiOCN (HCDS→$C_3H_6$→$NH_3$→$O_2$)×$n$⇒SiOCN (HCDS→$C_3H_6BCl_3$→$NH_3$)×$n$⇒SiBCN (HCDS $BCl_3$→$NH_3$)×$n$⇒SiBN

Moreover, for example, a titanium tetrachloride ($TiCl_4$) gas, a trimethylaluminum ($Al(CH_3)_3$, abbreviation: TMA) gas and the like may be used as the precursor to form a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO film) and the like on the substrate according to the following film forming sequences. Even in these cases, effects similar to those of the above-described embodiment may be obtained. Processing procedures and processing conditions at the time of supplying these precursors or the reactants may be, for example, the same as those at the time of supplying the precursors or the reactants in the above-described embodiment.

($TiCl_4$→$NH_3$)×$n$⇒TiN ($TiCl_4$→$NH_3$→$O_2$)×$n$⇒TiON ($TiCl_4$→TMA→$NH_3$)×$n$⇒TiAlCN ($TiCl_4$→TMA)×$n$⇒TiAlC ($TiCl_4$→TEA)×$n$⇒TiCN ($TiCl_4$→$H_2O$)×$n$⇒TiO

It is desirable that the recipes used for substrate processing are individually prepared according to the processing contents and are stored in the memory device 121c via an electric communication line or an external memory device 123. When starting a process, it is desirable that the CPU 121a properly selects an appropriate recipe from the recipes stored in the memory device 121c according to the contents of the substrate processing. Thus, it is possible for one substrate processing apparatus to form films of various film types, composition ratios, film qualities and film thicknesses with high reproducibility. In addition, it is possible to alleviate a burden borne by an operator and to quickly start a process while avoiding operation errors.

The aforementioned recipe is not limited to a newly prepared one, but may be prepared by, for example, changing an existing recipe already installed in the substrate processing apparatus. In the case of changing the recipe, the changed recipe may be installed in the substrate processing apparatus via an electric communication line or a recording medium in which the recipe is recorded. In addition, by operating the input/output device 122 provided in the existing substrate processing apparatus, the existing recipe already installed in the substrate processing apparatus may be directly changed.

In the above-described embodiment, there has been described an example in which a film is formed by using a batch-type substrate processing apparatus that processes a plurality of substrates at once. The present disclosure is not limited to the above-described embodiment. However, the present disclosure may be suitably applied to, for example, a case where a film is formed by using a single-substrate type substrate processing apparatus that processes one or several substrates at a time. Furthermore, in the above-described embodiment, there has been described an example in which a film is formed by using a substrate processing apparatus having a hot wall type processing furnace. The present disclosure is not limited to the above-described embodiment and may be suitably applied to a case where a film is formed by using a substrate processing apparatus having a cold-wall-type processing furnace. Even in the case of using these substrate processing apparatuses, film formation may be performed under the same sequence and processing conditions as in the above-described embodiment and modifications, and the same effects as those of the above embodiment and modifications may be obtained.

The Si film formed by the method of the above-described embodiment may be suitably used for applications such as formation of a contact plug by burying a contact hole, or the like.

In addition, the above-described various embodiments may be used in combination as appropriate. The processing procedures and processing conditions at this time may be, for example, the same as the processing procedures and processing conditions of the above-described embodiments.

Examples

Examples will be described below.

As an example, SiO films were formed on a plurality of wafers by the substrate processing apparatus shown in FIG. 1 according to the film forming sequence shown in FIG. 4. The configurations of nozzle A used for supplying a HCDS gas and a $H_2$ gas and nozzle B used for supplying an $O_2$ gas are the same as the configurations of the first and second nozzles (nozzles 249a and 249b) shown in FIG. 5A. The diameter of the ceiling hole provided in nozzle A was set to fall within a range of not less than two times to not more than eight times or less the diameter of each side hole provided in nozzle A. The configuration of nozzle B was the same as that of nozzle A except that the ceiling hole is not provided. The processing conditions were set to predetermined conditions falling within the processing condition range described in the above embodiments.

As a comparative example, SiO films were formed on a plurality of wafers according to the same film forming sequence as in the example. The configuration of nozzle C used for supplying a HCDS gas and a $H_2$ gas was the same as the configuration of nozzle A used in the example except that the ceiling hole is not provided. The configuration of nozzle D used for supplying an $O_2$ gas was the same as the configuration of nozzle B used in the example. The configurations of other members of the substrate processing apparatus were the same as the configurations of the respective members of the substrate processing apparatus used in the example. The processing conditions were the same as the processing conditions in the example.

Figure 6A:
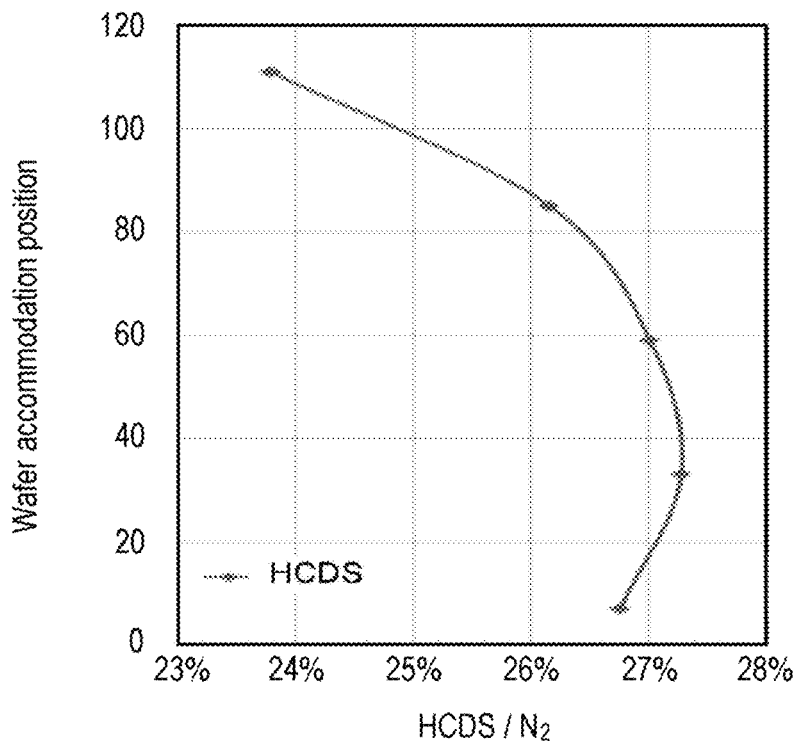
FIG. 6A is a diagram showing a concentration distribution of a HCDS gas in a process chamber of a comparative example.
Figure 6B:
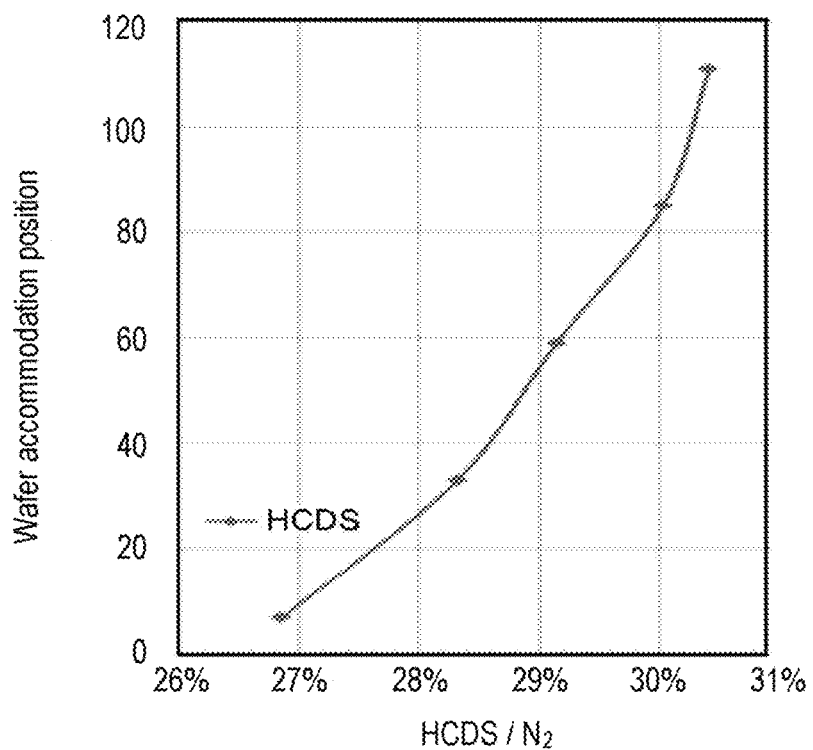
FIG. 6B is a diagram showing a concentration distribution of a HCDS gas in a process chamber of an example.

For each of the example and the comparative example, the concentration distribution of the HCDS gas in the process chamber when step 1 is performed was measured. FIG. 6A shows the concentration distribution of the HCDS gas in the comparative example and FIG. 6B shows the concentration distribution of the HCDS gas in the example. The vertical axes in FIGS. 6A and 6B indicate the wafer accommodation positions (numeral "120" indicates an upper portion, numeral "0" indicates a lower portion, and the same applies to the following description) in the wafer accommodating region. The horizontal axes in FIGS. 6A and 6B indicate the partial pressure ratio (HCDS/$N_2$) of the HCDS gas to the $N_2$ gas in the process chamber, which is synonymous with the concentration of the HCDS gas.

As shown in FIG. 6A, in the comparative example, the concentration of the HCDS gas in the upper region of the wafer accommodation region is significantly lower than the concentration of the HCDS gas in the central region or the lower region of the wafer accommodation region. On the other hand, as shown in FIG. 6B, in the example, the concentration of the HCDS gas in the upper region of the wafer accommodation region is greatly increased. From these facts, it can be noted that when supplying the HCDS gas using nozzle A in which the ceiling hole having a predetermined opening area is provided, as compared with the case where the HCDS gas is supplied using nozzle C in which the ceiling hole is not provided, it is possible to control the concentration distribution of the HCDS gas over a wide range, for example, to increase the concentration of the HCDS gas in the upper region of the wafer accommodation region.

Figure 7A:
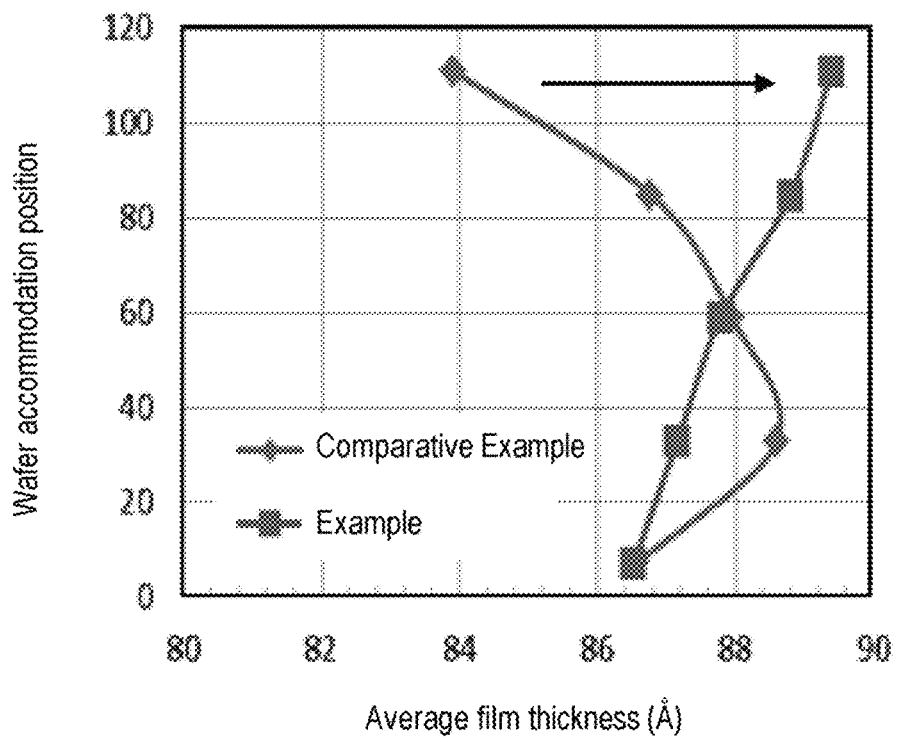
FIG. 7A is a diagram showing evaluation results of the wafer-to-wafer film thickness uniformity of SiO films of an example and a comparative example.
Figure 7B:
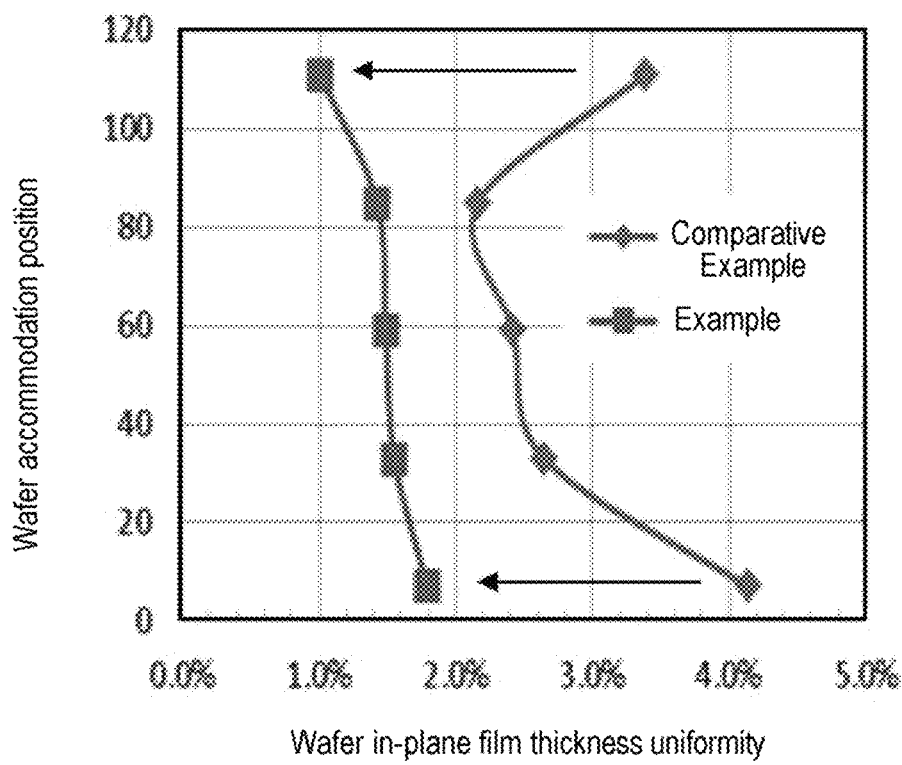
FIG. 7B is a diagram showing evaluation results of the wafer in-plane film thickness uniformity of SiO films of an example and a comparative example.

Subsequently, for each of the example and the comparative example, the film thickness of the SiO film formed on the wafer was measured, and the WtW and the WiW were evaluated. FIG. 7A is a diagram showing the evaluation results of the WtW, and FIG. 7B is a diagram showing the evaluation results of the WiW. The vertical axes in FIGS. 7A and 7B indicate the wafer accommodation positions in the wafer accommodation region. The horizontal axis in FIG. 7A indicates the average film thickness (Å) of the SiO film formed on each wafer, and the horizontal axis in FIG. 7B indicates the WiW of the SiO film formed on each wafer. The smaller the value of the WiW, the higher the uniformity of the film thickness in the wafer plane. In each of FIGS. 7A and 7B, ■ indicates the example, and ♦ indicates the comparative example.

As shown in FIG. 7A, in the comparative example, the average film thickness of the SiO film formed on the wafer accommodated in the upper region of the wafer accommodation region is thinner than the average film thickness of the SiO film formed on the wafer accommodated in the central region or the lower region of the wafer accommodation region. On the other hand, in the example, the average film thickness of the SiO film formed on the wafer accommodated in the upper region of the wafer accommodation region is thicker than the average film thickness of the SiO film formed on the wafer accommodated in the central region or the lower region of the wafer accommodation region. Comparing the distributions of the average film thickness of the SiO film between the wafers, the WtW was better in the example than in the comparative example. In addition, the wafer-to-wafer distributions of the average film thickness of the SiO films in the comparative example and the example have a tendency almost similar to the concentration distributions of the HCDS gas shown in FIGS. 6A and 6B. From these facts, it can be noted that when supplying the HCDS gas using nozzle A in which the ceiling hole having a predetermined opening area is provided, as compared with the case where the HCDS gas is supplied using nozzle C in which the ceiling hole is not provided, it is possible to optimize the concentration distribution of the HCDS gas in the wafer accommodation region, thereby improving the WtW.

As shown in FIG. 7B, in the comparative example, the SiO film formed on the wafer accommodated in the upper region or the lower region of the wafer accommodation region shows a stronger center convex distribution than the SiO film formed on the wafer accommodated in the central region of the wafer accommodation region, which results in lowering WiW. On the other hand, in the example, the WiW of the SiO film formed on the wafer accommodated in the upper region or the lower region of the wafer accommodation region is similar to the WiW of the SiO film formed on the wafer accommodated in the central region of the wafer accommodation region, which shows that all of the WiW are good. From these facts, it can be noted that by supplying the HCDS gas using the nozzle in which the ceiling hole having a larger aperture area than the side hole is provided, it is possible to optimize the concentration distribution of the HCDS gas in the wafer accommodation region, thereby improving the WiW over the entire wafer accommodation region.

Subsequently, for each of the example and the comparative example, the concentration distribution of the $H_2$ gas in the process chamber when step 2 is performed was measured. FIG. 8 shows the concentration distributions of the $H_2$ gas in the example and the comparative example. The vertical axis in FIG. 8 indicates the wafer accommodation positions in the wafer accommodation region. The horizontal axis in FIG. 8 indicates the partial pressure ratio ($H_2/O_2+N_2$) of the $H_2$ gas to the $O_2$ gas and the $N_2$ gas in the process chamber, which is synonymous with the concentration of the $H_2$ gas. In FIG. 8, the solid line indicates the example, and the broken line indicates the comparative example.

As shown in FIG. 8, the concentration distribution of the $H_2$ gas in the example is substantially the same as the concentration distribution of the $H_2$ gas in the comparative example. That is to say, the concentration distribution of the $H_2$ gas in the process chamber when using nozzle A in which the ceiling hole having a predetermined opening area is provided is almost the same as the concentration distribution of the $H_2$ gas in the process chamber when using nozzle C in which the ceiling hole is not provided. From this fact, it can be noted that even if the nozzle used for supplying the $H_2$ gas is shared with the nozzle used for supplying the HCDS gas, the WtW or the WiW of the SiO film formed on the wafer is hardly affected.

Subsequently, using the substrate processing apparatus used in the example, a SiON film was formed on a wafer according to a film forming sequence of performing a cycle a predetermined number of times, the cycle including sequentially and non-simultaneously supplying a HCDS gas, an $O_2+H_2$ gas and an $NH_3$ gas to the wafer. The supply of the HCDS gas and the $H_2$ gas was performed using nozzle A, and the supply of the $O_2$ gas and the $NH_3$ gas was performed using nozzle B. As a result, it was confirmed that the WtW and the WiW in the SiON film formed on the wafer show the same tendency as those of the SiO film formed in the example.

According to the present disclosure in some embodiments, it is possible to, when forming films on a plurality of substrates, improve the substrate-to-substrate film thickness uniformity of the films formed on the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber in which a process is performed to a substrate, the process including forming a film containing a main element;
a first nozzle connected to a precursor supply system to supply a precursor containing the main element to the substrate in the process chamber; and
a second nozzle connected to a reactant supply system to supply a reactant to the substrate in the process chamber,
wherein the first nozzle includes a first ceiling hole provided at a ceiling portion of the first nozzle and opened upward in a vertical direction, and a plurality of first side holes provided at a side portion of the first nozzle and opened in a horizontal direction,
wherein the second nozzle includes a second ceiling hole provided at a ceiling portion of the second nozzle and opened upward in a vertical direction, and a plurality of second side holes provided at a side portion of the second nozzle and opened in a horizontal direction,
wherein an opening area of the first ceiling hole is larger than an opening area of each of the plurality of first side holes,
wherein the opening area of the first ceiling hole is larger than an opening area of the second ceiling hole.

2. The substrate processing apparatus of claim 1, wherein a diameter of the first ceiling hole is not less than two times and not more than eight times a diameter of each of the plurality of first side holes.

3. The substrate processing apparatus of claim 1, wherein a diameter of the first ceiling hole is not less than two times and not more than eight times a diameter of each of the plurality of second side holes.

4. The substrate processing apparatus of claim 1, wherein a diameter of the first ceiling hole is not less than two times and not more than eight times a diameter of the second ceiling hole.

5. The substrate processing apparatus of claim 1, further comprising:
a controller configured to control the precursor supply system and the reactant supply system so as to perform the process including forming the film containing the main element on the substrate in the process chamber by performing a cycle a predetermined number of times, the cycle including:
supplying the precursor to the substrate via the first nozzle; and
supplying the reactant to the substrate via the second nozzle.

6. The substrate processing apparatus of claim 1:
wherein the reactant supply system is configured to supply a first reactant and a second reactant as the reactant,
wherein the substrate processing apparatus further comprises a controller configured to control the precursor supply system and the reactant supply system so as to perform the process including forming the film containing the main element on the substrate in the process chamber by performing a cycle a predetermined number of times, the cycle including:
supplying the precursor to the substrate via the first nozzle;
supplying the first reactant to the substrate via the second nozzle; and
supplying the second reactant to the substrate via the first nozzle.

7. The substrate processing apparatus of claim 1:
wherein the reactant supply system is configured to supply a first reactant and a second reactant as the reactant,
wherein the substrate processing apparatus further comprises a controller configured to control the precursor supply system and the reactant supply system so as to perform the process including forming the film containing the main element on the substrate in the process chamber by performing a cycle a predetermined number of times, the cycle including:
supplying the precursor to the substrate via the first nozzle; and
supplying the first reactant to the substrate via the second nozzle together with supplying the second reactant to the substrate via the first nozzle.

* * * * *